(12) United States Patent
Gill

(10) Patent No.: US 7,436,636 B2
(45) Date of Patent: Oct. 14, 2008

(54) DUAL CPP GMR SENSOR WITH IN-STACK BIAS STRUCTURE

(75) Inventor: Hardayal Singh Gill, Palo Alto, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 759 days.

(21) Appl. No.: 10/985,437

(22) Filed: Nov. 10, 2004

(65) Prior Publication Data

US 2006/0098352 A1    May 11, 2006

(51) Int. Cl.
*G11B 5/127* (2006.01)
(52) U.S. Cl. .................................................. 360/324.1
(58) Field of Classification Search ................ 360/314
See application file for complete search history.

(56) References Cited

U.S. PATENT DOCUMENTS

| | | | | |
|---|---|---|---|---|
| 6,023,395 | A | 2/2000 | Dill et al. | 360/113 |
| 6,114,719 | A | 9/2000 | Dill et al. | 257/295 |
| 6,671,139 | B2 * | 12/2003 | Carey et al. | 360/324.12 |
| 6,704,175 | B2 | 3/2004 | Li et al. | 360/324.11 |
| 6,741,432 | B2 | 5/2004 | Pinarbasi | 360/324.11 |
| 6,751,072 | B2 | 6/2004 | Freitag et al. | 360/324.11 |
| 2003/0062981 | A1 | 4/2003 | Hosomi et al. | 336/200 |
| 2003/0123198 | A1 | 7/2003 | Sugawara et al. | 360/314 |
| 2003/0143431 | A1 | 7/2003 | Hasegawa et al. | 428/692 |
| 2003/0184918 | A1 | 10/2003 | Lin et al. | 360/314 |
| 2003/0184919 | A1 | 10/2003 | Lin et al. | 360/314 |
| 2004/0057162 | A1 | 3/2004 | Gill | 360/314 |
| 2004/0075959 | A1 | 4/2004 | Gill | 360/324.12 |
| 2004/0085683 | A1 | 5/2004 | Lin et al. | 360/314 |
| 2004/0086751 | A1 | 5/2004 | Hasegawa et al. | 428/692 |
| 2004/0109264 | A1 | 6/2004 | Gill | 360/324.2 |
| 2005/0068688 | A1 * | 3/2005 | Sbiaa et al. | 360/324.1 |
| 2007/0063237 | A1 * | 3/2007 | Huai et al. | 257/295 |

OTHER PUBLICATIONS

Jeffrey R. Childress, Michael K. Ho, Robert E. Fontana, Matthew J. Carey, Philip M. Rice, Bruce A. Gurney, and Ching H. Tsang, "Spin-Valve and Tunnel-Valve Structures with In Situ In-Stack Bias," IEEE Transactions on Magnetics, vol. 38, No. 5, Sep. 2002.

* cited by examiner

*Primary Examiner*—Allen T Cao
(74) *Attorney, Agent, or Firm*—Zilka-Kotab, PC

(57) ABSTRACT

A dual current perpendicular to plane (CPP) sensor having an in stack bias structure disposed between first and second free layers. The hard bias structure includes a plurality of magnetic layers antiparallel coupled with one another. At least one of the magnetic layers of the in stack bias structure includes a layer of Ni sandwiched between first and second layer of NiFe. The Ni provides a strong negative magnetostriction that sets the moment of the magnetic layer in a desired direction parallel with the ABS while the NiFe layers at either side of the Ni provide good antiparallel coupling properties, allowing the magnetic layer to be antiparallel coupled with adjacent magnetic layers of the in stack bias structure.

20 Claims, 3 Drawing Sheets

DUAL CPP GMR SENSOR WITH IN-STACK BIAS STRUCTURE

FIELD OF THE INVENTION

The present invention relates to current perpendicular to plane (CPP) magnetoresistive sensors having improved having a novel in stack free layer bias structure that provides improved free layer stability.

BACKGROUND OF THE INVENTION

The heart of a computer is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air bearing surface (ABS). The suspension arm biases the slider into contact with the surface of the disk when the disk is not rotating but, when the disk rotates, air is swirled by the rotating disk. When the slider rides on the air bearing, the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a gap layer at an air bearing surface (ABS) of the write head and the pole piece layers are connected at a back gap. Current conducted to the coil layer induces a magnetic flux in the pole pieces which causes a magnetic field to fringe out at a write gap at the ABS for the purpose of writing the aforementioned magnetic impressions in tracks on the moving media, such as in circular tracks on the aforementioned rotating disk.

In recent read head designs a spin valve sensor, also referred to as a giant magnetoresistive (GMR) sensor, has been employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer and a free layer. First and second leads are connected to the spin valve sensor for conducting a sense current therethrough. The magnetization of the pinned layer is pinned perpendicular to the air bearing surface (ABS) and the magnetic moment of the free layer is located parallel to the ABS, but free to rotate in response to external magnetic fields. The magnetization of the pinned layer is typically pinned by exchange coupling with an antiferromagnetic layer.

The thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal and when the magnetizations of the pinned and free layer are antiparallel, scattering is maximized. Changes in scattering alter the resistance of the spin valve sensor in proportion to $\cos \theta$, where $\theta$ is the angle between the magnetizations of the pinned and free layers. In a read mode the resistance of the spin valve sensor changes proportionally to the magnitudes of the magnetic fields from the rotating disk. When a sense current is conducted through the spin valve sensor, resistance changes cause potential changes that are detected and processed as playback signals.

When a spin valve sensor employs a single pinned layer it is referred to as a simple spin valve. When a spin valve employs an antiparallel (AP) pinned layer it is referred to as an AP pinned spin valve. An AP spin valve includes first and second magnetic layers separated by a thin non-magnetic coupling layer such as Ru. The thickness of the spacer layer is chosen so as to antiparallel couple the magnetizations of the ferromagnetic layers of the pinned layer. A spin valve is also known as a top or bottom spin valve depending upon whether the pinning layer is at the top (formed after the free layer) or at the bottom (before the free layer).

The spin valve sensor is located between first and second nonmagnetic electrically insulating read gap layers and the first and second read gap layers are located between ferromagnetic first and second shield layers. In a merged magnetic head a single ferromagnetic layer functions as the second shield layer of the read head and as the first pole piece layer of the write head. In a piggyback head the second shield layer and the first pole piece layer are separate layers.

Magnetization of the pinned layer is usually fixed by exchange coupling one of the ferromagnetic layers (AP1) with a layer of antiferromagnetic material such as PtMn. While an antiferromagnetic (AFM) material such as PtMn does not in and of itself have a magnetization, when exchange coupled with a magnetic material, it can strongly pin the magnetization of the ferromagnetic layer.

In order to meet the ever increasing demand for improved data rate and data capacity, researchers have recently been focusing their efforts on the development of perpendicular recording systems. A traditional longitudinal recording system stores data as magnetic bits oriented longitudinally along a track in the plane of the surface of the magnetic disk. This longitudinal data bit is recorded by a fringing field that forms between a pair of magnetic poles separated by a write gap. A perpendicular recording system, on the other hand, records data as magnetic transitions oriented perpendicular to the plane of the magnetic disk. The magnetic disk has a magnetically soft underlayer covered by a thin magnetically hard top layer. The perpendicular write head has a write pole with a very small cross section and a return pole having a much larger cross section. A strong, highly concentrated magnetic field emits from the write pole in a direction perpendicular to the magnetic disk surface, magnetizing the magnetically hard top layer. The resulting magnetic flux then travels through the soft underlayer, returning to the return pole where it is sufficiently spread out and weak that it will not erase the signal recorded by the write pole.

The advent of perpendicular recording systems has lead to an increased interest in Current perpendicular to plane (CPP) sensors, which are particularly suited to use in perpendicular recording systems, due to their ability to read signals from a high coercivity medium. This is in part due to the short gap height afforded by such CPP sensors which allows them to read a very short bit of data. A CPP sensor differs from a more conventional current in plane (CIP) sensor such as that discussed above in that the sense current flows through the CPP sensor from top to bottom in a direction perpendicular to the plane of the layers making up the sensor. Whereas the more traditional CIP sensor has insulation layers separating it from the shields, the CPP sensor contacts the shields at its top and bottom surfaces, thereby using the shields as leads.

Another way to meet the increase need for data rate and data density is to increase the sensitivity or dr/R performance of the sensor. In theory, this can be achieved by constructing a sensor as a dual CPP sensor. A dual CPP sensor includes a free layer that is sandwiched between a pair of pinned layers. The addition of a second free layer/spacer layer/pinned layer interface increases the dr/R of the sensor significantly. As of yet, no practical dual CPP GMR sensor has been manufactured. This is in part due to the difficulty in aligning the magnetic moments of the free and pinned layers so that they are additive rather than subtractive. The magnetic moments of the free layers adjacent to each spacer layer must be oriented in the same direction, and the moments of the pinned layers adjacent to each spacer layer must also be oriented in the same direction to one another in order for the dual CPP sensor to operate.

Another challenge to constructing a practical dual CPP GMR is the necessity of having an insulation layer at either side of the sensor. In a CPP sensor, sense is conducted from the top of the sensor to the bottom of the sensor perpendicular to the plane of the layers by leads that also may act as magnetic shields. In order to prevent current from being shunted from one lead to the other across the hard bias layers that typically extend from the sides of the sensor an insulation layer must be provided to cover the sides of the sensor and at least one of the leads. This insulation layer weakens the magnetostatic coupling between the bias layer and the free layer. Therefore, traditional hard bias layers, formed at either side of the sensor, are less effective in a CPP sensor.

As track widths shrink, it would be desirable to place magnetic shields at the sides of the sensor to prevent the senor from being affected by magnetic signals from adjacent tracks (adjacent track interference). However, the hard bias layers typically placed at either sides of the sensor do not function as magnetic shields, due to their necessary high coercivity.

Therefore, there is a strong felt need for a practical design for a dual CPP magnetoresistive sensor. Such a design would preferably include a bias structure for biasing the free layer that would not be negatively affected by the need to have some sort of insulation layers at the sides of the sensor. Such a design would also preferably allow the use of side shields if desired.

SUMMARY OF THE INVENTION

The present invention provides a current perpendicular to plane dual magnetoresistive sensor having a novel in stack bias structure. The bias structure includes a plurality of antiparallel coupled magnetic layers at least one of which includes a layer of Ni sandwiched between first and second layers of NiFe.

Each of the magnetic layers of the bias structure is antiparallel coupled across a coupling layer such a Ru that is constructed of a thickness to strongly antiparallel couple the magnetic layers. This thickness can be 2-8 Angstroms or about 4 Angstroms. First and second free layers formed at the top and bottom of the in stack bias structure are separated by a thicker coupling layer (which can also be Ru) that is constructed of such a thickness as to weakly antiparallel couple the free layer with the bias structure. The coupling layers provided between the free layer and the bias structure can be for example 15-20 Angstroms or about 18 Angstroms. This weak coupling allows the free layers to have magnetic moments that are biased in a desired direction parallel with the ABS but free to rotate in response to an adjacent magnetic field.

The presence of Ni in the in stack bias structure advantageously provides a very strong negative magnetostriction, resulting in a strong magnetic anisotropy in a desired direction parallel with the ABS. Encasing the Ni layer within first and second layer of NiFe provides good antiparallel coupling with the other adjacent magnetic layers.

Constructing the dual CPP sensor with an in stack bias layer advantageously allows side magnetic shields to be installed at the sides of the sensor where hard bias layers would ordinarily be located. This allows the sensor to exhibit excellent track width control by avoiding adjacent track interference.

In addition, the use of an in stack bias structure avoids the problem of weak magnetostatic coupling and resulting weak biasing efficiency normally associated with the use of a standard hard bias layer formed at the sides of a CPP sensor and separated from the sensors stack by an insulation layer.

These and other features and advantages of the invention will be apparent upon reading of the following detailed description of preferred embodiments taken in conjunction with the Figures in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings which are not to scale.

BEST MODE FOR CARRYING OUT THE INVENTION

The following description is of the best embodiments presently contemplated for carrying out this invention. This description is made for the purpose of illustrating the general principles of this invention and is not meant to limit the inventive concepts claimed herein.

Figure 1:
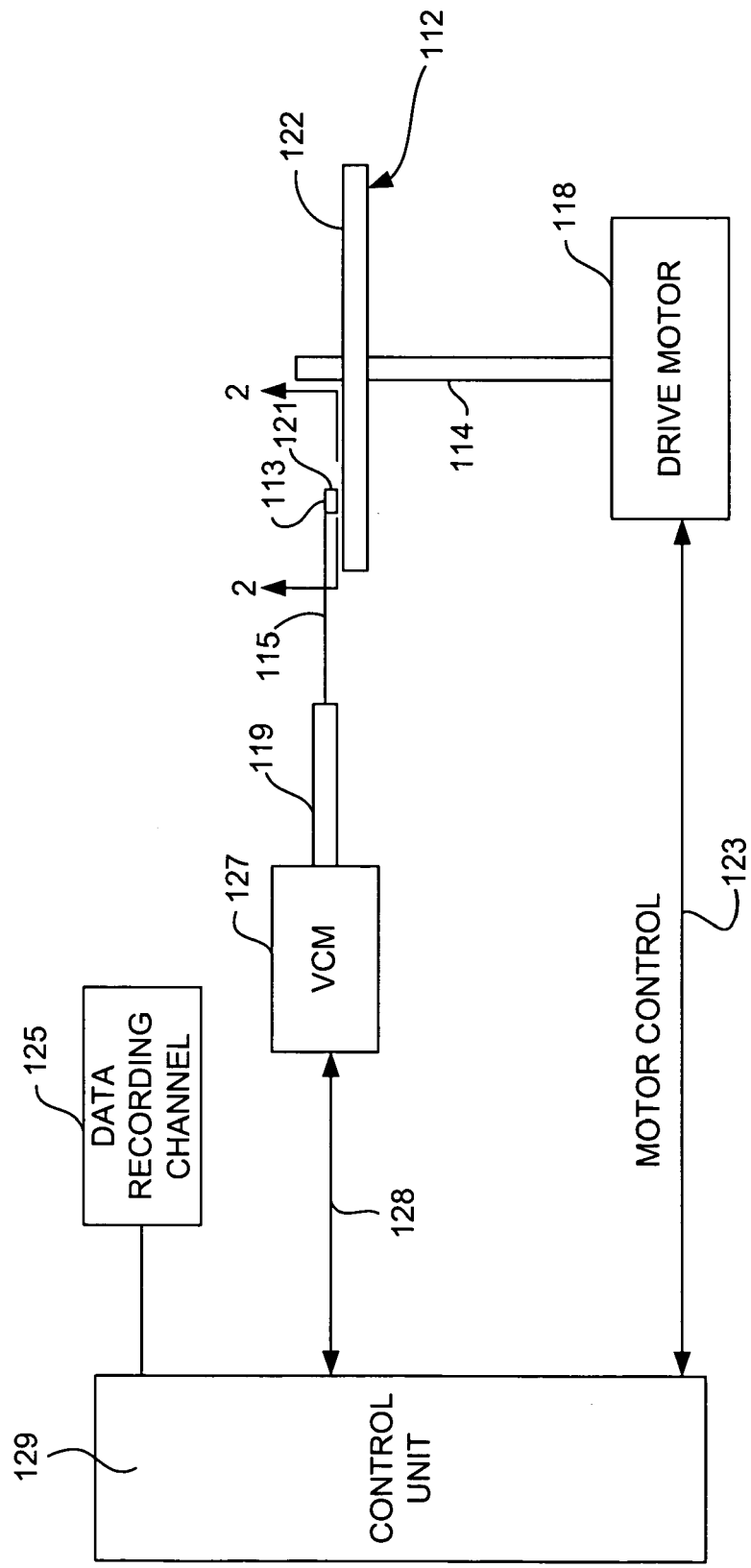
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written. Each slider 113 is attached to an actuator arm 119 by way of a suspension 115. The suspension 115 provides a slight spring force which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122 which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
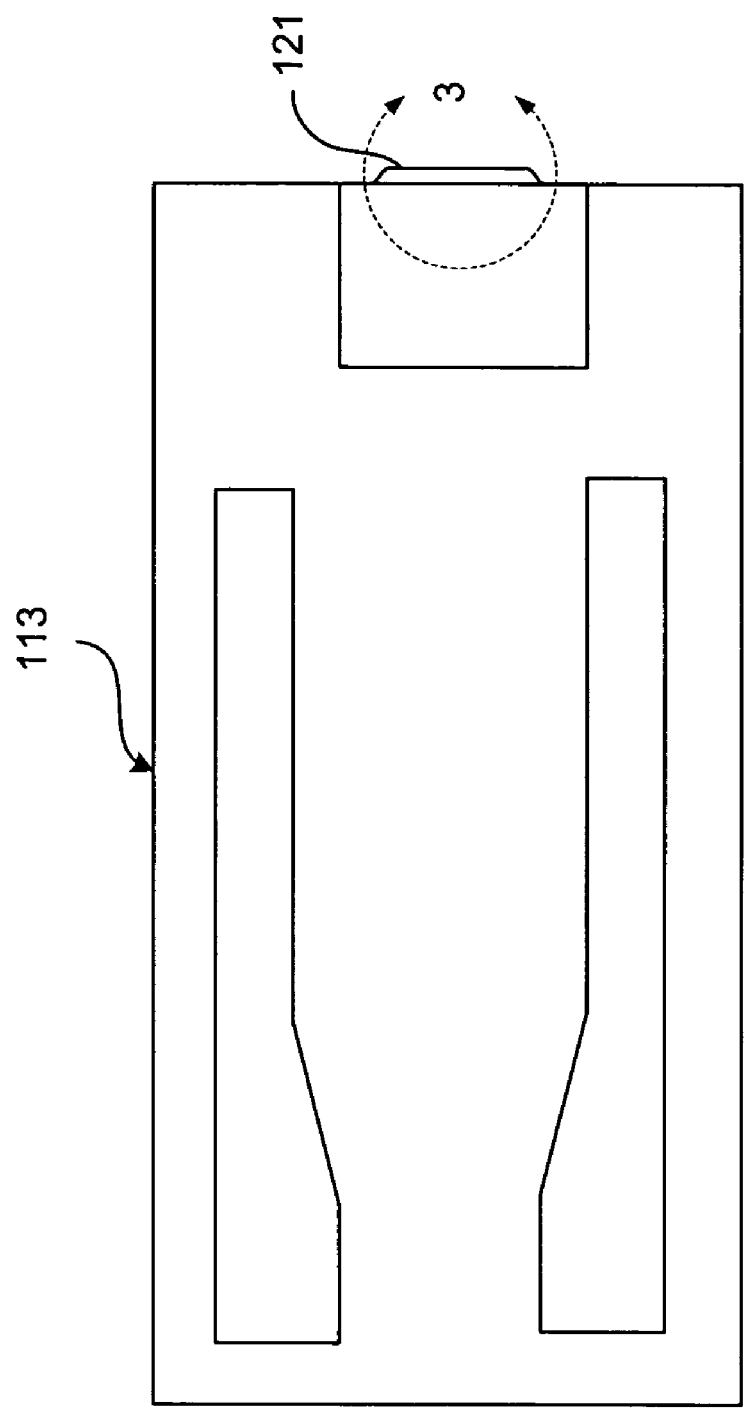
FIG. 2 is an ABS view of a slider illustrating the location of a magnetic head thereon.

With reference to FIG. 2, the orientation of the magnetic head 121 in a slider 113 can be seen in more detail. FIG. 2 is an ABS view of the slider 113, and as can be seen the magnetic head including an inductive write head and a read sensor, is located at a trailing edge of the slider. The above description of a typical magnetic disk storage system, and the accompanying illustration of FIG. 1 are for representation purposes only. It should be apparent that disk storage systems may contain a large number of disks and actuators, and each actuator may support a number of sliders.

Figure 3:
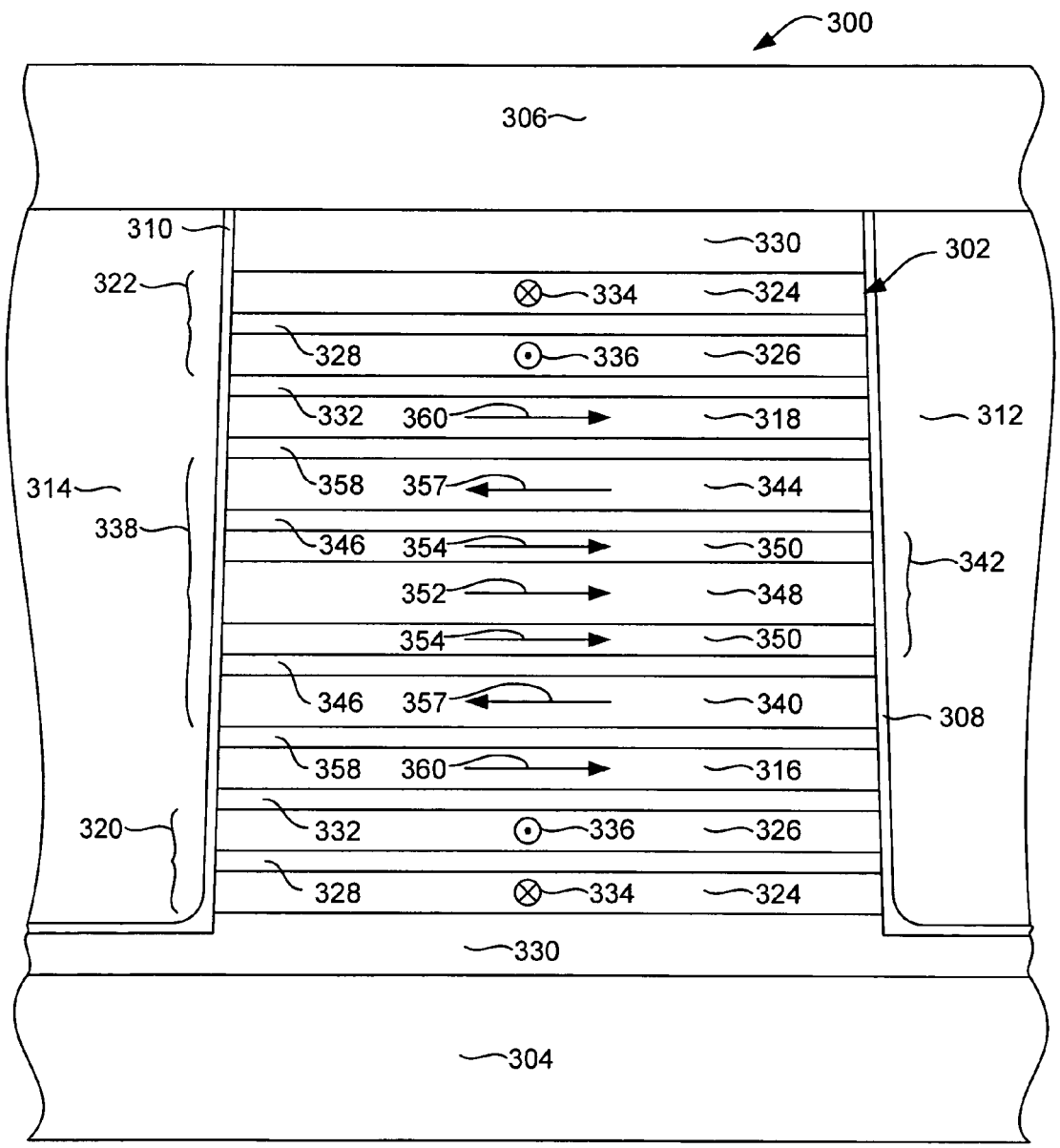
FIG. 3 is an ABS view of a magnetic sensor according to an embodiment of the present invention taken from circle 3 of FIG. 2.

With reference now to FIG. 3, a magnetoresistive sensor 300 according to an embodiment of the invention includes a magnetoresistive sensor element or sensor stack 302, sandwiched between first and second leads 304, 306. The first and second leads 304, 306 can be constructed of an electrically conductive, magnetic material such as NiFe and can thereby serve as magnetic shields as well as leads. First and second insulation layers 308, 310 are formed at the sides of the sensor stack 302 and extend over at least one of the leads 304, 306. In addition, first and second side shields 312, 314, constructed of a magnetic material such as NiFe may be provided at the sides of the sensor stack 302 being separated from the sensor stack by the insulation layers 308, 310. Optionally, the sides shields 312, 314 may be removed and an electrically insulating material such as $Al_2O_3$ may fill the area between the shields 304, 306 outside of the sensors stack 302.

The sensor stack 302 includes and first and second free layers 316, 318 and first and second pinned layer structures 320, 322. The free layers 316, 318 may be constructed of for example Co or CoFe. The pinned layer structures may be simple or AP pinned and may be self pinned or AFM pinned. As shown, in FIG. 3, the pinned layers 320, 322 are AP pinned AFM pinned layer structures each of which includes first and second magnetic layers (AP1 and AP2) 324, 326, antiparallel coupled across a non-magnetic, electrically conductive coupling layer 328 such as Ru. Also as shown in FIG. 3, the pinned layer structures 320, 322 are pinned by exchange coupling with a layer of antiferromagnetic material AFM layer 330. A first non-magnetic, electrically conductive spacer layer 332 such as Cu is sandwiched between the first free layer 316 and first pinned layer structure 320 and also between the second free layer 318 and second pinned layer structure 322. It should be pointed out that the present invention could be practiced in a tunnel valve structure in which case the non-magnetic, electrically conductive spacer layer 332 would be replaced by a thin, non-magnetic, electrically insulating barrier layer.

With continued reference to FIG. 3, the magnetic layers 324, 326 of the pinned layer structures 320, 322 each have a magnetic moment 334, 336 oriented perpendicular to the ABS, with the magnetic layers 326 closest to the spacer layer 322 having moments 336 that are preferably in the same direction as one another.

The sensor stack includes an in stack bias structure 338 having first, second and third magnetic layers 340, 342, 344, each magnetic layer being antiparallel coupled with its adjacent magnetic layer across a non-magnetic, electrically conductive coupling layer 346 sandwiched there between. The non-magnetic, electrically conductive coupling layers 346 are can be for example Ru and are each constructed of such a thickness as to strongly antiparallel couple the magnetic layers 340, 342, 344. For example, these coupling layers 346 can have a thickness of 2-8 Angstroms or about 4 Angstroms.

One or more of the magnetic layers 340, 342, 344 of the bias structure 338 includes a layer of Ni 348 sandwiched between first and second layers of NiFe 350. The remaining magnetic layers 340, 344 can be constructed for example as single layers of NiFe. While only the second layer 342 is shown as having a layer of Ni 348 embedded within layers of NiFe 350, it should be understood any or all of the magnetic layers 340, 342, 344 can be constructed to have the described embedded Ni layer 348.

Magnetoresistive sensors are inevitably subjected to laterally applied compressive stresses. If a magnetic material within the sensor stack has a negative magnetostriction, that negative magnetostriction, combined with the compressive stresses, cause that material to have a magnetic anisotropy in a direction parallel with the ABS of the sensor. While NiFe has some negative compressive stress, it has been found that Ni has a very strong negative compressive stress.

With continued reference to FIG. 3, the Ni layer 348 has a negative magnetostriction lambda=$125 \times 10E-6$. This produces a magnetic anisotropy (Hk) of 1000 Oe when subjected to a typical compressive stress of 500 MPa in a direction parallel with the ABS. This strong anisotropy causes the layer 348 to have a magnetic moment 352 that is oriented in a desired direction parallel with the ABS. The adjacent NiFe layers 350, which are exchange coupled with the Ni layer 348, then, have magnetic moments 354 that are oriented in the same direction.

Although the Ni layer 348 provides an advantageous strong negative magnetostriction, Ni does not provide good antiparallel coupling. Therefore, the NiFe layers 350 are provided at either side of the Ni layer 348 in order provide exceptional antiparallel coupling across the coupling layers 346. This antiparallel coupling across the coupling layers 346 causes the first and third magnetic layers 340, 344 to have magnetic moments 357 that are oriented antiparallel to the moment 352 of the Ni layer 348.

The first and third magnetic layers 340, 344 preferably have a magnetic thicknesses that when summed together equal the magnetic thickness of the middle magnetic layer 342. Magnetic thickness is defined as the intrinsic magnetic moment of a material multiplied by the thickness of the material. If the magnetic thicknesses of the outer magnetic layers 340, 344 summed together equal the magnetic thickness of the middle layer 340, then the net moment of the bias structure 338 will be zero and the moments 354, 357 will be strongly pinned. Therefore, the magnetic thicknesses of the outer layers 340, 344 summed together preferably equals the magnetic thickness of the middle layer 342 plus or minus 10%.

By way of example, the outer magnetic layers 340, 344 can be constructed to have thicknesses of 10-20 Angstroms or about 15 Angstroms each. The middle magnetic layer 342 can be constructed, such that the Ni layer 348 has a thickness of 15-25 Angstroms or about 20 Angstroms, and the outer NiFe layers 350 can be constructed to have thicknesses of 5-15 Angstroms or about 10 Angstroms each. It should be noted that FIG. 3 as well as all of the other figures are for representation only and are not to scale.

With reference still to FIG. 3, each of the free layers 316, 318 is separated from the magnetic layers 340, 344 of the bias structure 338 by an antiparallel coupling layer 358. The coupling layers 358, which can be for example Ru, are constructed of such a thickness to weakly antiparalle couple the free layer 316, 318 with the adjacent magnetic layer 350, 344. This thickness of the coupling layer 358 can be for example 15-20 Angstroms or about 18 Angstroms. This weak antiparallel coupling causes the free layers 316, 318 to have magnetic moments 360 oriented in the same direction as one another and antiparallel to the moments 357 of the adjacent magnetic layer 340, 344.

The above described structure provides excellent stable biasing of the free layers 316, 318, the biasing being assisted by the stress in the sensor 300. It should be pointed out that the number of magnetic layer is by way of example. For example any odd number of magnetic layers could be used to construct a GMR sensor having free layers biased in the same direction as described. Three layers is, however, preferred in order minimize electron scattering at the interfaces of the layers.

In addition, however, an odd number of magnetic layers (for example two) could be used so that the free layers 314, 316 would be biased in opposite directions. Such a design would be useful in a differential GMR design. In such a sensor the pinned layers 320, 322 would have magnetic moments set such that each of the magnetic layers 326, closest to its respective spacer layer 332 would be oriented in opposite directions. Such a differential sensor would then provide a resulting from the difference between the magnetoresistive effects of the top and bottom GMR sensors.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described exemplary embodiments, but should be defined only in accordance with the following claims and their equivalents.

What is claimed is:

1. A current perpendicular to plane (CPP) magnetoresistive sensor, comprising
    a first pinned layer structure;
    a second pinned layer structure;
    an in stack bias structure disposed between the first and second pinned layer structures;
    a first magnetic free layer disposed between the first pinned layer structure and the in stack bias structure; and
    a second magnetic free layer disposed between the second pinned layer structure and the in stack bias structure;
    the in stack bias structure further comprising:
        a first magnetic layer;
        a second magnetic layer;
        a third magnetic layer disposed between the first and second magnetic layers;
        a first non-magnetic coupling layer sandwiched between the first magnetic layer and the first free layer;
        a second non-magnetic coupling layer sandwiched between the second magnetic layer and the second free layer;
        a third non-magnetic coupling layer sandwiched between the first magnetic layer and the third magnetic layer; and
        a fourth non-magnetic coupling layer sandwiched between the second magnetic layer and the third magnetic layer;
        at least one of the first second and third magnetic layers comprising a layer of Ni sandwiched between first and second layers of NiFe.

2. A sensor as in claim 1 wherein:
    the third magnetic layer comprises a layer of Ni sandwiched between first and second layers of NiFe;
    the first and second magnetic layers each consist of NiFe.

3. A sensor as in claim 1, wherein:
    the first and second magnetic layers each consist of NiFe and each have a thickness of 10-20 Angstroms;
    the third magnetic layer has a thickness of 35-45 Angstroms and includes a layer of Ni sandwiched between a first and second layers of NiFe.

4. A sensor as in claim 1, wherein the first and second non-magnetic coupling layers comprise Ru and have a thickness of 15-20 Angstroms, and the third and fourth non-magnetic coupling layers each comprise Ru and have a thickness of 2-8 Angstroms.

5. A sensor as in claim 1 wherein the first and second magnetic layers have magnetic thicknesses the sum of which is equal to a magnetic thickness of the third magnetic layer plus or minus 10%.

6. A sensor as in claim 1, wherein the first free layer is separated from the first pinned layer structure by a first non-magnetic, electrically conductive spacer layer and the second free layer is separated from the second pinned layer structure by a second non-magnetic, electrically conductive spacer layer.

7. A sensor as in claim 1, wherein the first free layer is separated from the first pinned layer structure by a first non-magnetic, electrically insulating barrier layer and the second free layer is separated from the second pinned layer structure by a second non-magnetic, electrically insulating barrier layer.

8. A sensor as in claim 1 wherein the first and second free layer and the third magnetic layer each have a magnetic moment that is oriented in a first direction, and the first and second magnetic layers each have a magnetic moment that is oriented in a second direction that is antiparallel with the first direction.

9. An in stack bias structure for use in a dual CPP magnetoresistive sensor, comprising:
    a plurality of magnetic layer structures at least one of the magnetic layer structures including a layer of Ni imbedded within first and second layers of NiFe; and
    a non-magnetic, electrically conductive antiparallel coupling layer disposed between each of the magnetic layer structures.

10. An in stack bias structure as in claim 9 wherein each of the non-magnetic, electrically conductive antiparallel coupling layers disposed between each of the plurality of magnetic layers has a thickness of 2-8 Angstroms; the sensor further comprising first and second non-magnetic coupling layers each having a thickness of 15-20 Angstroms disposed at the top and bottom of the bias structure.

11. A bias structure as in claim 10 wherein the bias structure includes an odd number of magnetic layers.

12. A bias structure as in claim 10 wherein the bias structure includes an even number of magnetic layers and wherein the bias structure is used in a differential giant magnetoresistive sensor.

13. A magnetoresistive sensor comprising:
first and second free layers;
an in stack bias structure disposed between the first and second free layers;
a first non-magnetic, electrically conductive antiparallel coupling layer disposed between the first free layer and the bias structure;
a second non-magnetic, electrically conductive antiparallel coupling layer dispose between the second free layer and the bias structure;
the bias structure further comprising:
first, second and third magnetic layers at least one of which includes a layer of Ni sandwiched between first and second layers of NiFe;
a third non-magnetic antiparallel coupling layer disposed between the first and second magnetic layers; and
a fourth non-magnetic antiparallel coupling layer disposed between the second and third magnetic layers.

14. A sensor as in claim 13 wherein the first and second non-magnetic coupling layers each comprise Ru and have a thickness of 15-20 Angstroms, and the third and fourth magnetic layers comprise Ru have a thickness of 2-10 Angstroms.

15. A sensor as in claim 13 wherein the second ferromagnetic layer is disposed between the first and third magnetic layers and wherein the first and third magnetic layers have magnetic thicknesses the sum of which equals a magnetic thickness of the second magnetic layer.

16. A magnetoresistive sensor comprising:
first and second free layers;
an in stack bias structure disposed between the first and second free layers;
a first non-magnetic, electrically conductive antiparallel coupling layer disposed between the first free layer and the bias structure;
a second non-magnetic, electrically conductive antiparallel coupling layer dispose between the second free layer and the bias structure;
the bias structure further comprising:
first, and second magnetic layers at least one of which includes a layer of Ni sandwiched between first and second layers of NiFe;
a third non-magnetic antiparallel coupling layer disposed between the first and second magnetic layers.

17. A sensor as in claim 16 wherein the first and second non-magnetic coupling layers each comprise Ru and have a thickness of 15-20 Angstroms, and the third non-magnetic antiparallel coupling layer comprises Ru and has a thickness of 2-8 Angstroms.

18. A sensor as in claim 16 wherein the first and second have magnetic moments that are antiparllel to one another and the first and second free layers have magnetic moments that are antiparallel to one another.

19. A magnetic disk drive, comprising:
a magnetic disk;
an actuator;
a suspension;
a slider attached to the suspension for movement adjacent to a surface of the magnetic disk; and
a magnetoresistive sensor connected with the slider, the sensor comprising:
first and second free layers;
a plurality of magnetic layers, antiparallel coupled to one another at least one of the plurality of magnetic layers including a layer of Ni sandwiched between first and second layers of NiFe.

20. A sensor as in claim 19 further comprising:
a first layer of Ru having a thickness of 15-20 Angstroms disposed between the first free layer and the plurality of magnetic layers,
a second layer of Ru having a thickness of 15-20 Angstroms disposed between the first free layer and the plurality of magnetic layers; and
a layer of Ru having a thickness of 2-8 Angstroms disposed between each of the plurality of magnetic layers.

* * * * *